(12) United States Patent
Park et al.

(10) Patent No.: US 7,626,228 B2
(45) Date of Patent: Dec. 1, 2009

(54) NAND-TYPE NON-VOLATILE MEMORY DEVICES HAVING A STACKED STRUCTURE

(75) Inventors: Jae-Kwan Park, Gyeonggi-do (KR); Ki-Nam Kim, Seoul (KR); Soon-Moon Jung, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 195 days.

(21) Appl. No.: 11/637,686

(22) Filed: Dec. 12, 2006

(65) Prior Publication Data

US 2007/0165455 A1 Jul. 19, 2007

(30) Foreign Application Priority Data

Dec. 12, 2005 (KR) ................ 10-2005-0121779

(51) Int. Cl.
*H01L 29/792* (2006.01)
*H01L 23/48* (2006.01)
*H01L 23/52* (2006.01)

(52) U.S. Cl. ............ 257/326; 257/777; 257/E27.026

(58) Field of Classification Search ............ 257/314, 257/315, 326, 777, E27.026; 365/154, 185.01, 365/185.02, 185.03

See application file for complete search history.

(56) References Cited

U.S. PATENT DOCUMENTS

| 5,321,286 | A | | 6/1994 | Koyama et al. | |
| 5,429,968 | A | * | 7/1995 | Koyama | 438/152 |
| 5,835,396 | A | * | 11/1998 | Zhang | 365/51 |
| 6,172,381 | B1 | * | 1/2001 | Gardner et al. | 257/67 |
| 6,429,484 | B1 | * | 8/2002 | Yu | 257/347 |
| 6,867,453 | B2 | * | 3/2005 | Shin et al. | 257/314 |
| 2004/0125629 | A1 | * | 7/2004 | Scheuerlein et al. | 365/17 |

FOREIGN PATENT DOCUMENTS

| JP | 05-036942 | 2/1993 |
| JP | 05-036989 | 2/1993 |
| JP | 02-368141 | 12/2002 |
| KR | 10-1993-0011245 | 9/1996 |

* cited by examiner

*Primary Examiner*—Shouxiang Hu
(74) *Attorney, Agent, or Firm*—Myers Bigel Sibley & Sajovec, P.A.

(57) ABSTRACT

A NAND-type nonvolatile memory device includes a semiconductor substrate and a first ground selection line and a first string selection line disposed on the substrate in parallel to each other. A plurality of parallel first word lines are interposed on the substrate between the first ground selection line and the first string selection line. A first impurity-doped region is formed in the semiconductor substrate adjacent to the first word lines, the first ground selection line, and the first string selection line. A first interlayer dielectric layer is disposed on the first ground selection line, the first string selection line, the plurality of first word lines, and the semiconductor substrate. An epitaxial contact plug contacts the semiconductor substrate through the first interlayer dielectric layer. A single crystalline semiconductor layer is disposed on the first interlayer dielectric layer that contacts the epitaxial contact plug. A plurality of parallel second word lines is disposed on the single crystalline semiconductor layer. A second impurity-doped region formed in the single crystalline semiconductor layer adjacent to the second word lines. A second interlayer dielectric layer is disposed on the plurality of second word lines and the single crystalline semiconductor layer.

5 Claims, 11 Drawing Sheets

NAND-TYPE NON-VOLATILE MEMORY DEVICES HAVING A STACKED STRUCTURE

CROSS-REFERENCE TO RELATED APPLICATION

This U.S. non-provisional patent application claims priority under 35 U.S.C § 119 to Korean Patent Application 2005-121779 filed on Dec. 12, 2005, the entire contents of which are hereby incorporated by reference.

BACKGROUND OF THE INVENTION

The present invention relates to semiconductor devices, methods of forming the same, and methods of operating the same. More particularly, the present invention relates to NAND-type nonvolatile memory devices having a stacked structure, methods of forming the same, and methods of operating the same.

A NAND-type nonvolatile memory device connects predetermined numbers of cells to NAND-type logic to increase an integration density of an array. Because a contact number in a cell array. in a NAND-type memory device is considerably less than that of a comparable NOR-type device, a size of a chip may be relatively small. Accordingly, the demand for NAND-type nonvolatile memory devices generally increases in accordance with high-integration and large-capacitance trends of semiconductor memory devices.

A conventional NAND-type nonvolatile memory device includes cell arrays in a first layer on the semiconductor substrate. However, in accordance with high-integration and large-capacitance trends of semiconductor memory devices, a size of cell arrays realized on a flat surface of the first layer is becoming smaller and the number of cell arrays is simultaneously increasing. Accordingly, as high-integration and large-capacitance progress according to the limits of photolithography processing, it may be difficult to realize cell arrays in the first layer of a NAND-type nonvolatile memory device.

SUMMARY OF THE INVENTION

Exemplary embodiments of the present invention are directed to a NAND-type nonvolatile memory device having a stacked structure along with methods of forming the same and operating the same. In some embodiments of the present invention, a NAND-type nonvolatile memory device includes a semiconductor substrate and a first ground selection line and a first string selection line disposed on the substrate in parallel to each other. A plurality of parallel first word lines are interposed on the substrate between the first ground selection line and the first string selection line. A first impurity-doped region is formed in the semiconductor substrate adjacent to the first word lines, the first ground selection line, and the first string selection line. A first interlayer dielectric layer is disposed on the first ground selection line, the first string selection line, the plurality of first word lines, and the semiconductor substrate. An epitaxial contact plug contacts the semiconductor substrate through the first interlayer dielectric layer. A single crystalline semiconductor layer is disposed on the first interlayer dielectric layer that contacts the epitaxial contact plug. A plurality of parallel second word lines is disposed on the single crystalline semiconductor layer. A second impurity-doped region formed in the single crystalline semiconductor layer adjacent to the second word lines. A second interlayer dielectric layer is disposed on the plurality of second word lines and the single crystalline semiconductor layer.

In other embodiments, a NAND-type nonvolatile memory device is formed by providing a semiconductor substrate, forming a first ground selection line and a first string selection line on the substrate in parallel to each other, forming a plurality of parallel first word lines on the substrate between the first ground selection line and the first string selection line, forming a first impurity-doped region formed in the semiconductor substrate adjacent to the first word lines, the first ground selection line, and the first string selection line, forming a first interlayer dielectric layer on the first ground selection line, the first string selection line, the plurality of first word lines, and the semiconductor substrate, patterning the first interlayer dielectric layer to form a hole that exposes the semiconductor substrate, forming an epitaxial contact plug that contacts the semiconductor substrate in the hole, forming a single crystalline semiconductor layer on the first interlayer dielectric layer that contacts the epitaxial contact plug, forming a plurality of parallel second word lines on the single crystalline semiconductor layer, forming a second impurity-doped region in the single crystalline semiconductor layer adjacent to the second word lines, and forming a second interlayer dielectric layer on the plurality of second word lines and the single crystalline semiconductor layer.

In further embodiments, a NAND-type nonvolatile memory device includes a cell string that includes a plurality of cell transistors. The plurality of cell transistors includes a plurality of parallel sub-strings. A first one of the sub-strings includes a first plurality of cell transistors connected to first word lines and a second one of the sub-strings includes a second plurality of cell transistors connected to second word lines. A ground selection transistor is connected to a ground selection line on one side of the plurality of sub-strings and a string selection transistor is connected to a string selection line on another side of the plurality of sub-strings. A cell in such a device may be read by applying a read voltage to one of the first word lines associated with the cell of the first one of the sub-strings, applying a pass voltage to the other ones of the first word lines connected to the first one of the sub-strings, and applying a voltage of less than zero volts to the word lines connected to the second one of the sub-strings.

BRIEF DESCRIPTION OF THE DRAWINGS

Other features of the present invention will be more readily understood from the following detailed description of exemplary embodiments thereof when read in conjunction with the accompanying drawings, in which.

DETAILED DESCRIPTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. It will be understood that when an element is referred to as being "connected" or "coupled" to another element, it can be directly connected or coupled to the other element or intervening elements may be present. In contrast, when an element is referred to as being "directly connected or coupled" to another element, there are no intervening elements present. Furthermore, "connected" or "coupled" as used herein may include wirelessly connected or coupled. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures were turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

In the description, a term "substrate" used herein may include a structure based on a semiconductor, having a semiconductor surface exposed. It should be understood that such a structure may contain silicon, silicon on insulator, silicon on sapphire, doped or undoped silicon, epitaxial layer supported by a semiconductor substrate, or another structure of a semiconductor. And, the semiconductor may be silicon-germanium, germanium, or germanium arsenide, not limited to silicon. In addition, the substrate described hereinafter may be one in which regions, conductive layers, insulation layers, their patterns, and/or junctions are formed.

Figure 1:
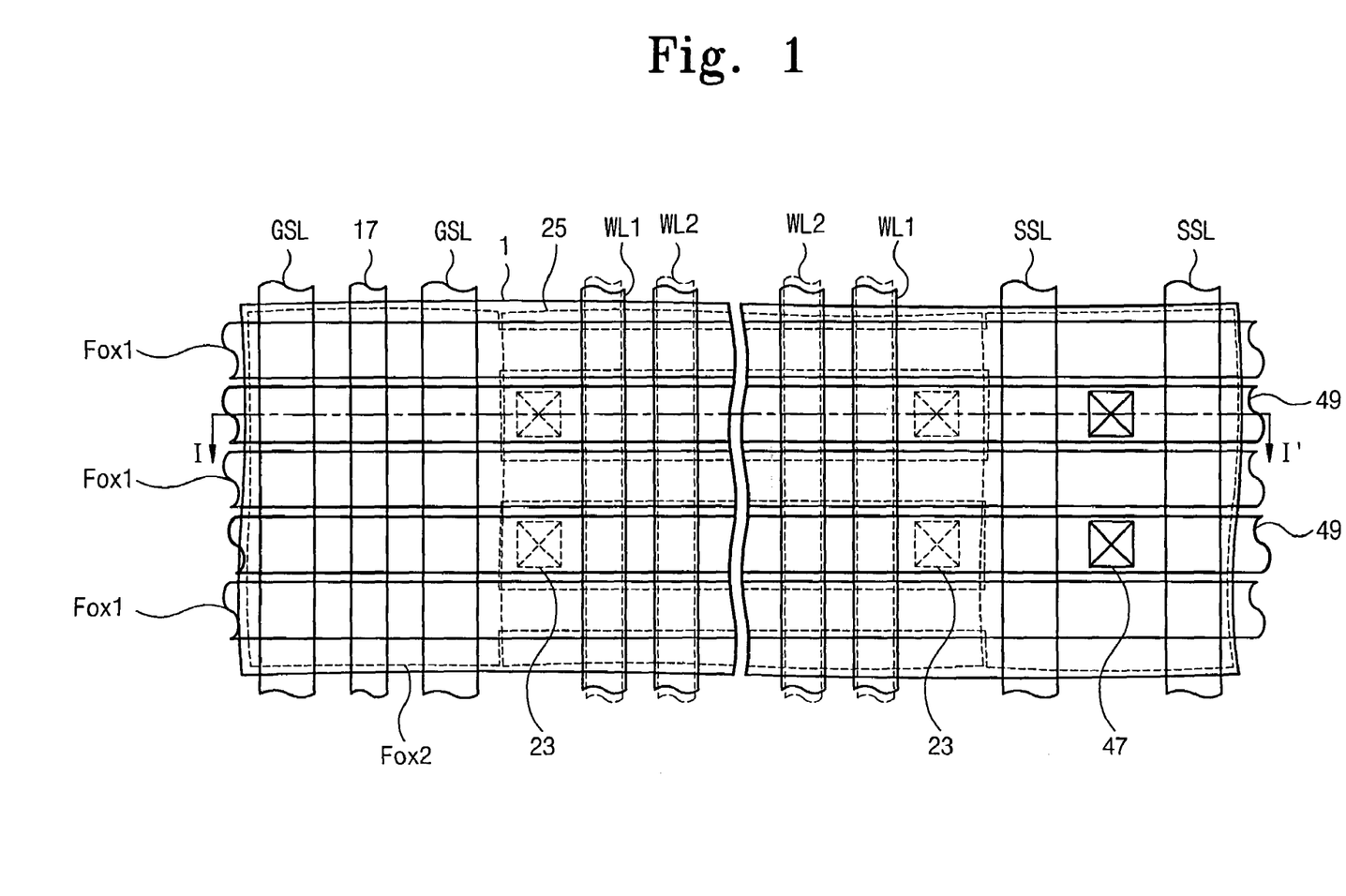
FIG. 1 is a plane diagram illustrating a NAND-type nonvolatile memory device having a stacked structure according to some embodiments of the present invention.
Figure 2:
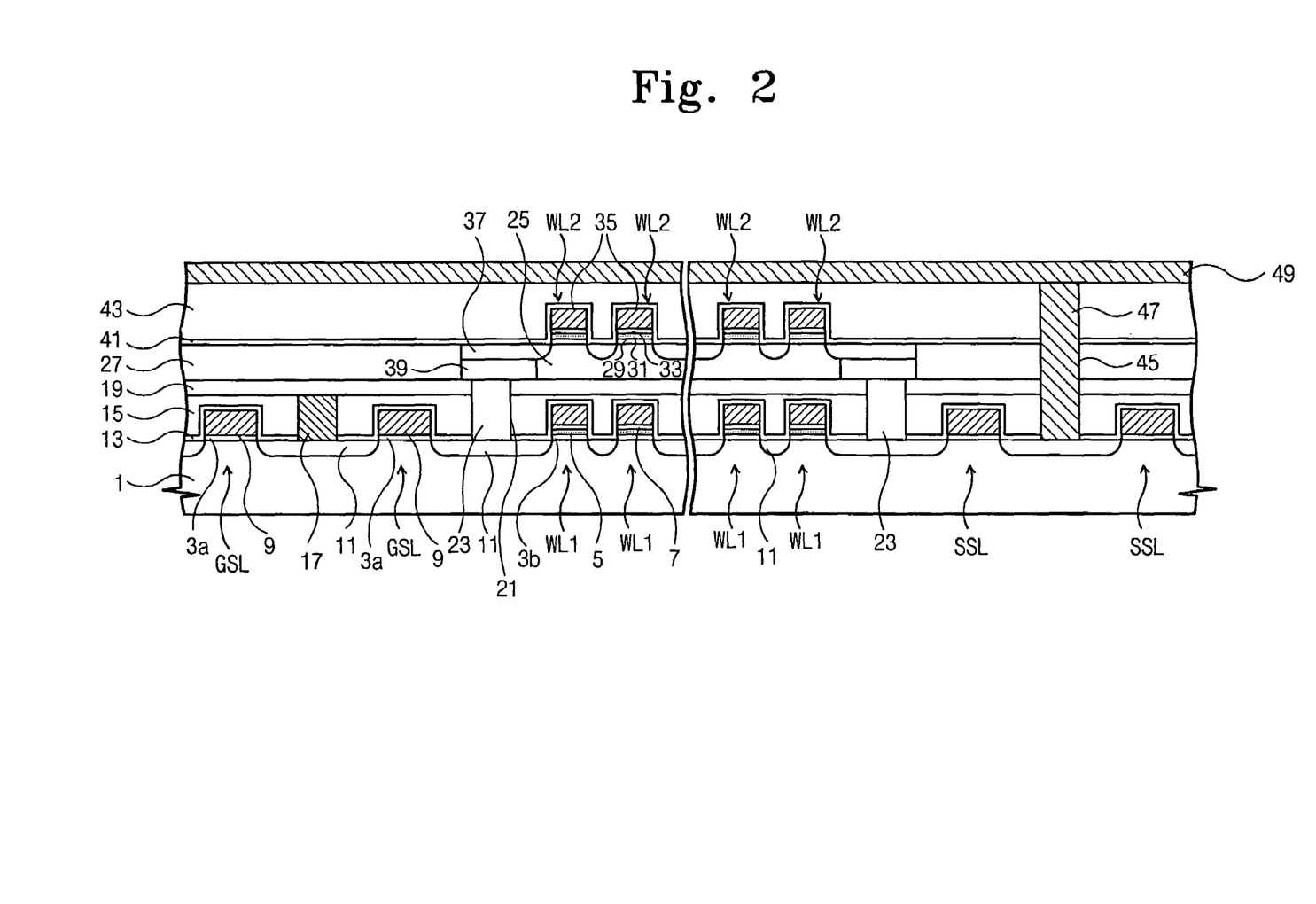
FIG. 2 is a cross-sectional view taken along I-I' line of FIG. 1.

FIG. 1 is a plane view illustrating a NAND-type nonvolatile memory device having a stacked structure according to some embodiments of the present invention. FIG. 2 is a cross-sectional view. taken along line I-I' of FIG. 1.

Referring to FIG. 1 and FIG. 2, a plurality of parallel first device isolation layers Fox1 are formed to define an active region in a semiconductor substrate 1 and a ground selection line GSL and a string selection line SSL cross the first device isolation layer Fox1 in parallel. A plurality of parallel first word lines WL1 are arranged between the ground selection line GSL and the string selection line SSL. A first impurity-doped region 11 is located in the semiconductor substrate 1 on both sides of the lines GSL, SSL, WL1. The first word lines WL1 are connected to a plurality of first cell transistors including a first tunnel insulation layer 3b, a first charge storage layer 5, a first blocking insulation layer 7, and a first gate electrode 9 that are stacked sequentially. The string selection line SSL and the ground selection line GSL are connected to string selection transistors and ground selection transistors, respectively, including a gate dielectric layer 3a and a first gate electrode 9 that are stacked sequentially. The string selection line SSL and the ground selection line GSL do not include the first charge storage layer 5.

A first etch stopping layer 13, a first lower interlayer dielectric layer 15, and a first upper interlayer dielectric layer 19 are formed to cover the lines GSL, SSL, WL1 sequentially. A common source line 17 is located between the ground selection line GSL and a neighboring ground selection line GSL and penetrates the first lower interlayer dielectric layer 15 and the first etch stopping layer 13 to contact the first impurity-doped region 11. Between the ground selection line GSL and a neighboring first word line WL1, and between the string selection line SSL and a neighboring first word line WL1, an epitaxial contact plug 23 is located in a hole 21 penetrating the first upper interlayer dielectric layer 19, the first lower interlayer dielectric layer 15, and the first etch stopping layer 13 to electrically connect to the first impurity-doped region 11.

Referring to FIG. 1 and FIG. 2, a single crystalline semiconductor layer 25 contacting the epitaxial contact plug 23 is located on the first upper interlayer dielectric layer 19. A second device isolation layer Fox2, 27 is arranged in the single crystalline semiconductor layer 25 to define an active region. A plurality of second word lines WL2 are arranged in parallel on the single crystalline semiconductor layer 25 to cross the second device isolation layer Fox2, 27. The second word lines WL2 are connected to second cell transistors including a second tunnel insulation layer 29, a second charge storage layer 31, a second blocking insulation layer 33, and a second gate electrode 35 that are stacked sequentially.

The second word lines WL2 overlap the first word lines WL1. A second impurity-doped region 37 is located in the single crystalline semiconductor layer 25 on both sides of the second word lines WL2. An impurity-doped contact region 39 may exist in the single crystalline semiconductor layer 25 between the epitaxial contact plug 23 and the second impurity-doped region 37 to electrically connect the epitaxial contact plug 23 and the second impurity-doped region 37. Without the impurity-doped contact region 39, the second impurity-doped region 37 may directly contact the epitaxial contact plug 23. A second etch stopping layer 41 and a second interlayer dielectric layer, 43 are formed sequentially to cover the second word lines WL2. A bit line contact plug 47 is located in a bit line contact hole 45 that penetrates the second interlayer dielectric layer 43, the second etch stopping layer 41, the second device isolation layer 27, the first upper interlayer dielectric layer 19, the first lower interlayer dielectric layer 15, and the first etch stopping layer 13 to expose the semiconductor substrate 1 between the string selection line SSL and a neighboring string selection line SSL. A plurality of parallel bit lines 49 electrically connected to the bit line contact plug 47 are arranged on the second interlayer dielectric layer 43.

Referring to FIG. 1 and FIG. 2, the epitaxial contact plug 23 electrically connects the first impurity-doped region 1 located between the first word line WL1 and the first ground selection line GSL1 and between the first word line WL1 and the first string selection line SSL1 to the second impurity-doped region 37 located at both edges of a plurality of the second word lines WL2. First cell transistors connected to the first word lines WL1 and located at the same active region comprise a first sub-string and second cell transistors connected to the second word lines WL2 and located at the same active region comprise a second sub-string. A one cell string includes a ground selection transistor connected to the ground selection line GSL, a string selection transistor connected to the string selection line SSL, and the first and second sub-strings located therebetween. That is, the one cell string includes parallel structured sub-strings. The cell string is symmetrically arranged in iterative fashion.

Although not illustrated, a well may be formed in the semiconductor substrate 1 and the single crystalline semiconductor layer 25. According to the thickness of the single crystalline semiconductor layer 25 and depth of the second impurity-doped region 37, predetermined numbers of cell arrays are electrically interconnected in the single crystalline semiconductor layer 25 and it is possible to use the single crystalline semiconductor layer 25 as a partially or completely depleted silicon on insulator SOI substrate form.

Referring to the NAND-type nonvolatile memory device of FIG. 1 and FIG. 2, the word lines WL1, WL2 have a plurality of layers so that a cell size may be reduced regardless of a limit associated with a photolithography process. Also, a control circuit, such as the string selection line SSL and the ground selection line GSL, may be formed on the semiconductor substrate 1 of approximately perfect semiconductor crystallizations to stably operate the device. Because the NAND-type nonvolatile memory device is not a floating gate but a charge trapping gate including a charge storage layer, operation errors due parasitic couplings of floating gates may be reduced or prevented, a vertical height may be reduced, and operation errors due to defects of an oxide layer may be reduced.

In the above-described embodiments, the word lines WL1, WL2 are arranged on double layers; however word lines can be arranged on more than three single crystalline semiconductor layers as stated above.

Figure 3:
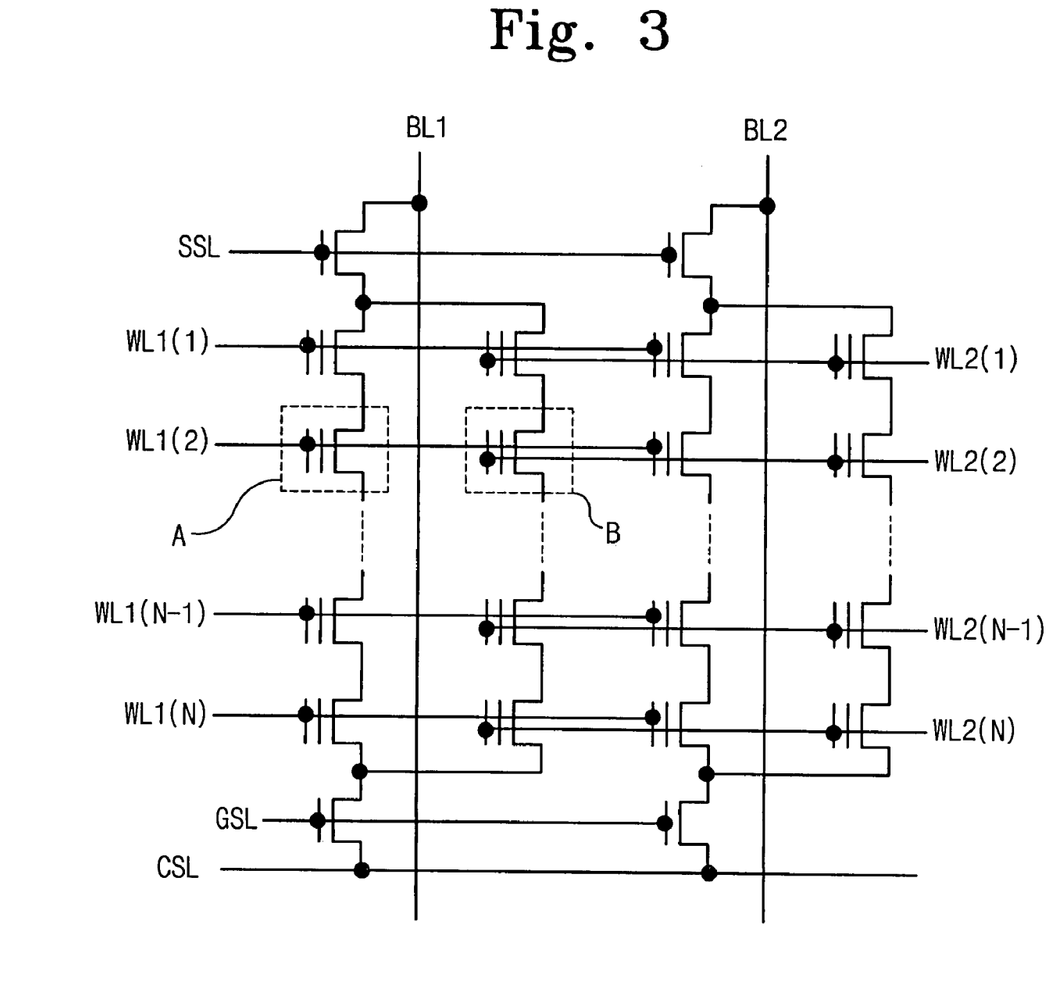
FIG. 3 is an equivalent circuit diagram illustrating a NAND-type nonvolatile memory device of FIG. 1 according to some embodiments of the present invention.

Referring to FIG. 3, methods of operating the NAND-type nonvolatile memory device of FIGS. 1 and 2, according to some embodiments of the present invention, will now be described. FIG. 3 is an equivalent circuit diagram illustrating the NAND-type nonvolatile memory device of FIG. 1 according to some embodiments of the present invention.

Referring to FIG. 3, n first word lines WL1(1), WL1(2), . . . , WL1(N-1), WL1(N) are arranged between the string selection line SSL and the ground selection line GSL and second word lines WL2(1), WL2(2), . . . , WL2(N-1), WL2(N) are arranged in the other region. The first word lines WL1(1), WL1(2), . . . , WL1(N-1), WL1(N) are connected to a plurality of first cell transistors, respectively, and the second word lines WL2(1), WL2(2), . . . , WL2(N-1), WL2(N) are connected to a plurality of second cell transistors, respectively. The first cell transistors comprise the first sub-strings and the second cell transistors comprise the second sub-strings. The first sub-strings and the second sub-strings are connected in parallel. A drain region (not illustrated) adjacent to the string selection line SSL is connected to bit lines BL1, BL2. A source region (not illustrated) adjacent to the ground selection line GSL is connected to the common source line CSL.

When a cell transistor A is programmed in the equivalent circuit diagram of FIG. 3, Vcc (a reference voltage) is applied to a string selection line SSL, zero volts 0V are applied to a selected bit line BL1, Vcc is applied to an unselected bit line BL2, zero volts 0V are applied to a ground selection line GSL and about 0 to 0.2 volts are applied to a common source line CSL. A program voltage, for example about twenty volts 20V, is applied to a selected cell word line WL1(2) and a pass voltage, for example about ten volts 10V, is applied to unselected cell word lines WL1(1), . . . , WL1(N-1), WL1(N), WL2(1), WL2(2), . . . , WL2(N-1), WL2(N). As a result, a channel voltage of the cell transistor A becomes about zero volts 0V and the cell transistor is programmed by a Fowler-Nordheim FN tunneling because of a large voltage difference between the gate electrode and the channel. However, unselected cell transistors are not programmed because of no tunneling.

In the equivalent circuit diagram of FIG. 3, when a cell transistor B located at an upper layer is programmed, Vcc (a reference voltage) is applied to a string selection line SSL, zero volts 0V are applied to a selected bit line BL1, Vcc is applied to an unselected bit line BL2, zero volts 0V is applied to a ground selection line GSL, and about 0 to 0.2 volts are applied to the common source line CSL. A program voltage, for example about twenty volts 20V, is applied to a selection cell word line WL2(2) and a pass voltage, for example about ten volts 10V, is applied to unselected cell word lines WL1(1), WL1(2), ..., WL1(N-1), WL1(N), WL2(1), ..., WL2(N-1), WL2(N).

When a cell transistor A is read in the equivalent circuit diagram of FIG. 3, a read voltage, for example about zero volts 0V, is applied to a selected cell word line WL1(2) and a pass voltage, for example about 4.5 volts, is applied to other word lines WL1(1), ..., WL1(N-1), WL1(N), connected to the sub-string including a selected cell. A ground voltage or a minus voltage is applied to word lines WL2(1), WL2(2), ..., WL2(N-1), WL2(N) connected to a sub-string not including the selected cell to turn off. A bit line voltage is applied to a selected bit line BL1, a ground voltage is applied to an unselected bit line BL2, a reference voltage is applied to a ground selection line GSL and a string selection line SSL, and a ground voltage to about 0.2 volts are applied to a common source line CSL. Because word lines are connected as a parallel structure in a plurality of layers, the voltage is selectively applied to the layer not to result in a parallel path in the read operation.

When a cell transistor B is read in the equivalent circuit diagram of FIG. 3, a read voltage, for example about zero volts 0V, is applied to a selected cell word line WL2(2), a pass voltage, for example about 4.5 volts, is applied to other word lines WL2(1), ..., WL2(N-1), WL2(N) connected to a sub-string including a selected cell. A ground voltage or a minus voltage is applied to word lines WL1(1), WL1(2), ..., WL1(N-1), WL1(N) connected to a sub-string not including the selected cell to turn off. A bit line voltage is applied to a selected bit line BL1, a ground voltage is applied to an unselected bit line BL2, a reference voltage is applied to a ground selection line GSL and a string selection line SSL, and a ground voltage to about 0.2 volts is applied to a common source line CSL.

In the equivalent circuit diagram of FIG. 3, an erase operation may be carried out as a block unit. A common source line CSL and bit lines BL1, BL2 are floated, zero volts 0V are applied to word lines, and an erase voltage is applied to a semiconductor substrate (reference number 1 of FIG. 2) and a well (not illustrated) of a single crystalline semiconductor layer (reference number 25 of FIG. 2) to remove electrons trapped in the charge storage layers (reference numbers 5 and 31 of FIG. 2).

FIGS. 4 through 8 are flow charts illustrating methods of forming a NAND-type nonvolatile memory device of FIG. 2.

Figure 4:
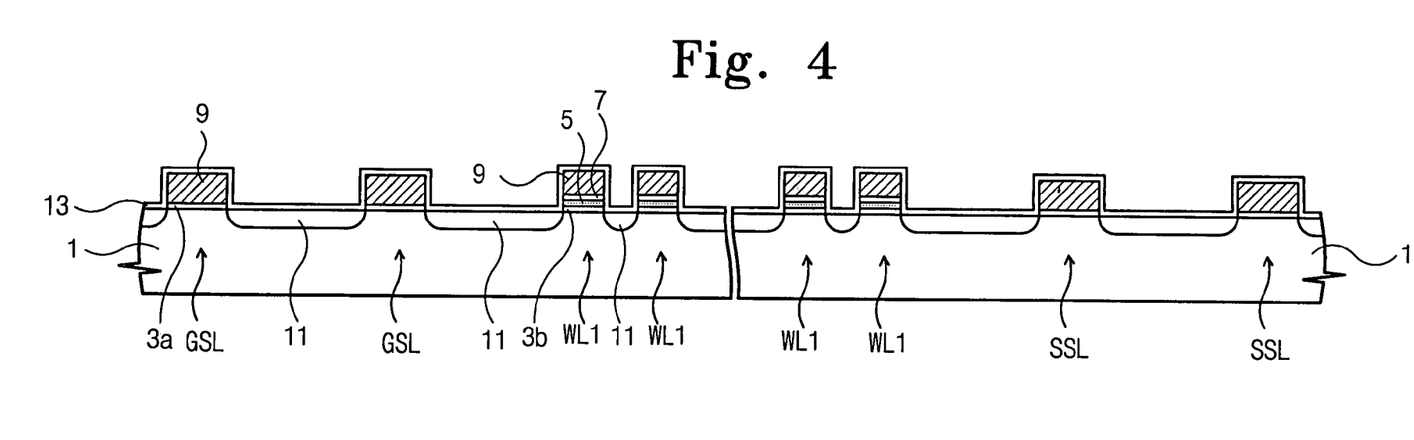
FIGS. 4 through 8 are flow charts illustrating methods of forming a NAND-type nonvolatile memory device of FIG. 2 according to some embodiments of the present invention.

Referring to FIG. 4, a first device isolation layer (Fox 1 of FIG. 1) is formed in a semiconductor substrate to define an active region. A heat oxide layer (not illustrated), a first charge storage layer 5, and a first blocking insulation layer 7 are formed in the semiconductor substrate 1. The blocking insulation layer 7 and the first charge storage layer 5 are removed in a region where selection lines GSL, SSL will be formed. Otherwise, after a heat oxide layer (not illustrated) and a first charge storage layer 5 are first formed, the first charge storage layer 5 is removed in a region where selection lines GSL, SSL will be formed. Subsequently, a first blocking insulation layer 7 is formed on an entire surface. The selection lines GSL, SSL do not include a first charge storage layer 5. The heat oxide layer may be a first tunnel oxide layer 3b of first word lines WL1 or a gate dielectric layer 3a of selection lines GSL, SSL. A first gate electrode layer 9 is formed over an entire surface of the semiconductor substrate 1 where the first blocking insulation layer 7 is formed. For example, the first blocking insulation layer 7 may be formed of a silicon oxide layer and the first charge storage layer 5 may be formed of a silicon nitride layer. The first gate electrode layer 9, the first blocking insulation layer 7, the first charge storage layer 5, and the heat oxide layer (not illustrated) are patterned to form a plurality of first word lines WL1. The first gate electrode layer 9 and the heat oxide layer (not illustrated) are patterned to form selection lines GSL, SSL. An ion-implantation process is carried out to form an impurity-doped region 11 in the semiconductor substrate 1 on both sides of the lines WL1, SSL, GSL. A first etch stopping layer 13 is conformably formed on an entire surface of the semiconductor substrate 1.

Figure 5:
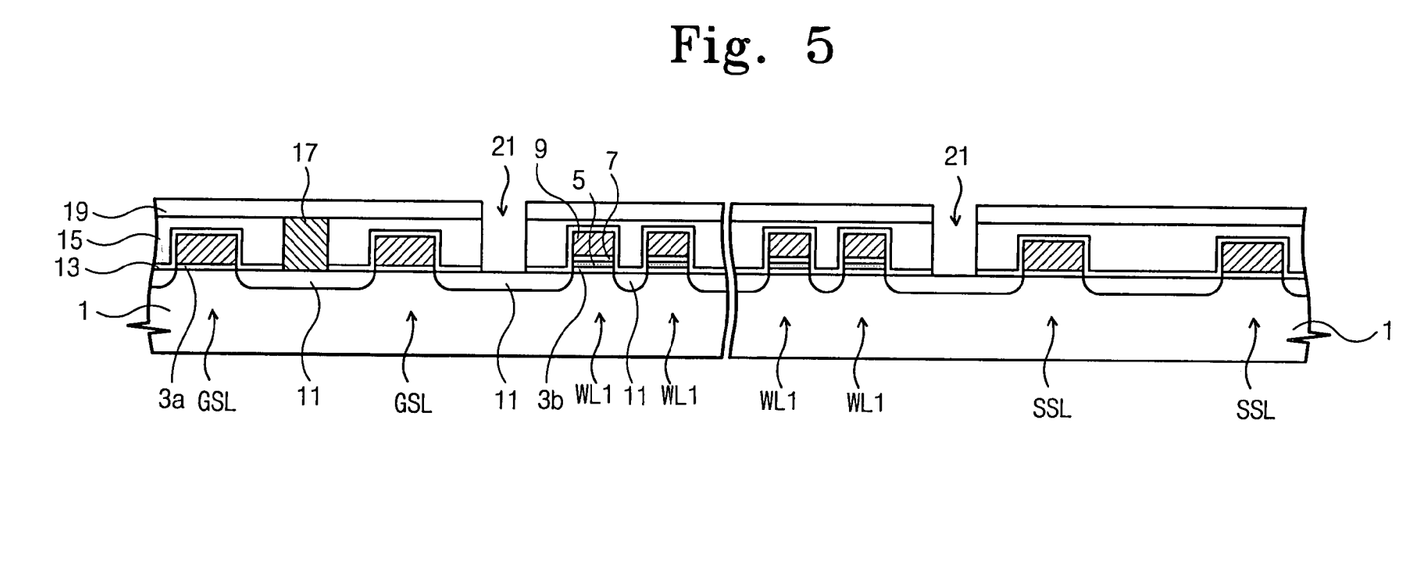

Referring to FIG. 5, a first lower interlayer dielectric layer 15 is stacked on the first etch stopping layer 13. The first lower interlayer dielectric layer 15 and the first etch stopping layer 13 is patterned to form a common source line groove (not illustrated) exposing the first impurity-doped region 11 between the ground selection line GSL and a neighboring ground selection line GSL. The groove is filled by a conductive layer and then planarized to form a common source line 17. A first upper interlayer dielectric layer 19 is stacked on an entire surface of the semiconductor substrate 1 where the common source line 17 is formed. The first lower interlayer dielectric layer 15 and the first upper interlayer dielectric layer 19 comprise a first interlayer dielectric layer. The first upper interlayer dielectric layer 19, the first lower interlayer dielectric layer 15, and the first etch stopping layer 13 are patterned to form a contact hole exposing the semiconductor substrate 1 between the ground selection line GSL and a neighboring first word line WL1, and between the string selection line SSL and a neighboring first word line WL1.

Figure 6:
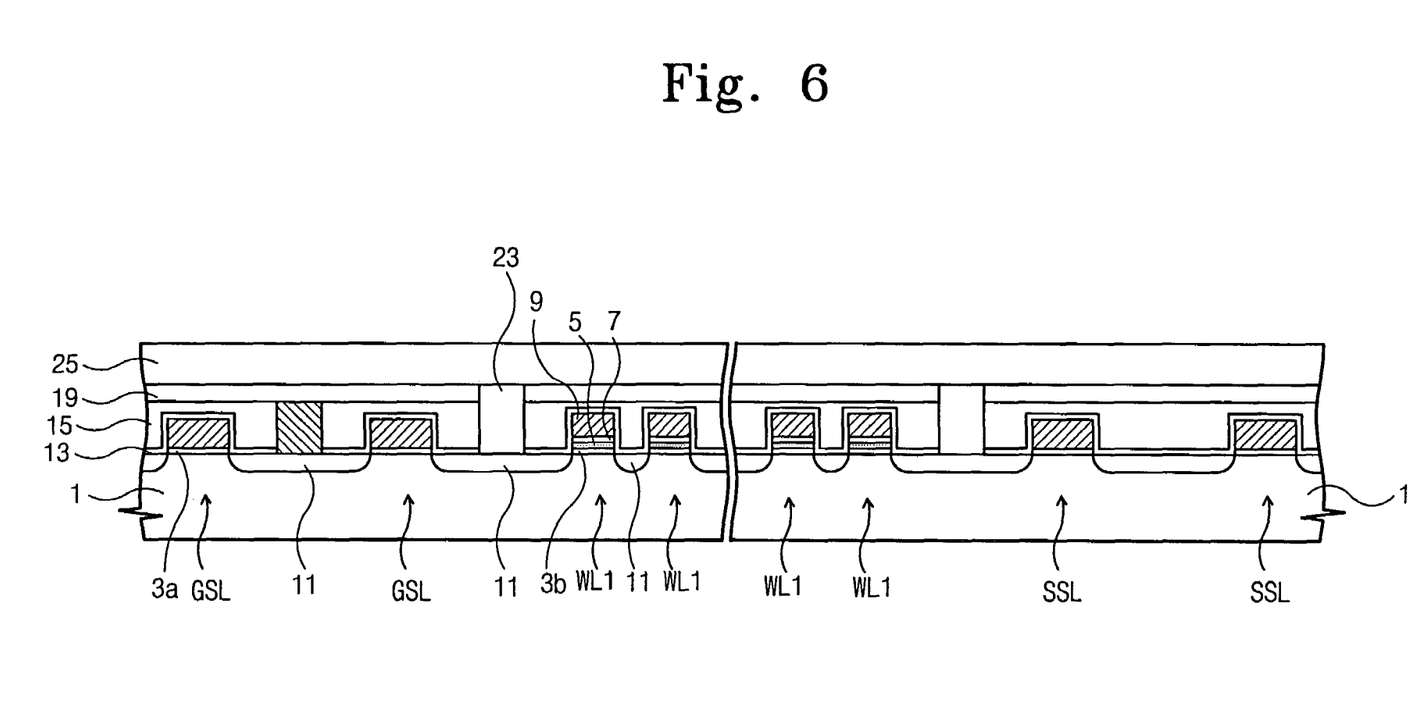

Referring to FIG. 6, an epitaxial layer may be grown using selective epitaxial growth SEG from the semiconductor substrate 1 exposed by the contact hole 21 to form an epitaxial contact plug 23 filling the contact hole 21. While the epitaxial layer is grown, an impurity may be doped by an in-situ process. For example, arsenic or phosphorus may be used as dopants at a dose of $1 \times 10^{18}$ to $1 \times 10^{20}$ atoms per cm$^3$. A single crystalline semiconductor layer 25 is formed on an entire surface of the semiconductor substrate 1 where the epitaxial contact plug 23 is formed. The single crystalline semiconductor layer 25 may be formed by continuously growing the epitaxial layer after filling the contact hole 21. Otherwise, the single crystalline semiconductor layer 25, for example, may be formed by using a solid phase epitaxial SPE method such that an amorphous polysilicon layer (not illustrated) is stacked and a heat-treatment process, such as a laser annealing, is carried out to change the amorphous polysilicon layer so as to have a single crystalline silicon structure. As a result, an upper surface of the epitaxial contact plug 23 may function as a single crystalline seed layer. The planarization process may be carried out on an upper surface of the single crystalline semiconductor layer 25.

Figure 7:
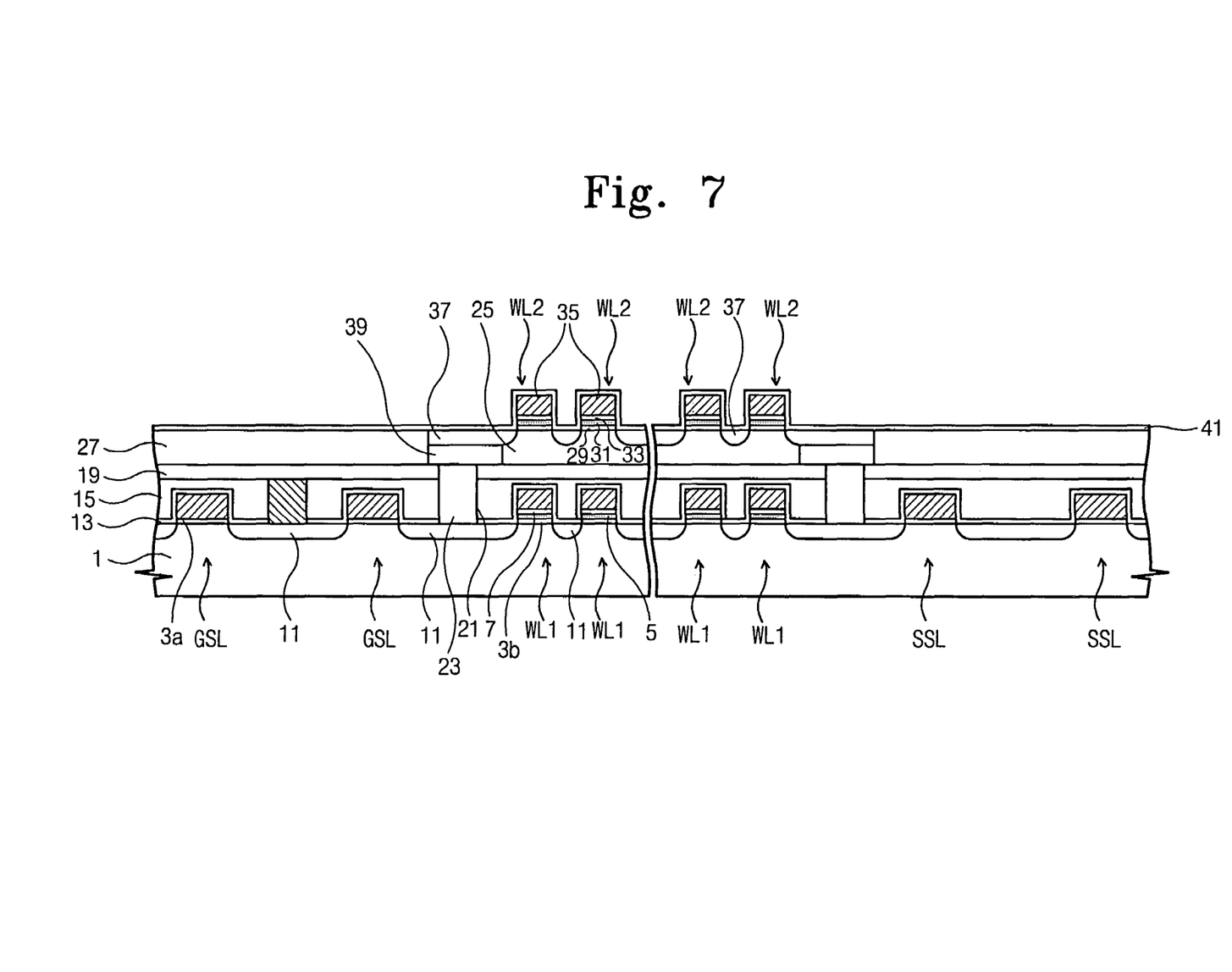

Referring to FIG. 7, a second device isolation layer 27 (Fox2 of FIG. 1) is formed by a shallow trench isolation method in the single crystalline semiconductor layer 25 to define an active region. The second device isolation layer 27 may be formed by filling a second interlayer dielectric layer 43 formed in a subsequent process. A second tunnel oxide layer 29, a second charge storage layer 31, a second blocking insulation layer 33, and a second gate electrode layer 35 are stacked on the single crystalline semiconductor layer 25 and patterned to form a plurality of second word lines WL2. A second impurity-doped region 37 is formed in the single crystalline semiconductor layer 25 on both sides of the second word lines WL2 by using an ion-implantation mask on the second word lines. An impurity-doped contact region 39 is formed by using a separate ion-implantation mask on the single crystalline semiconductor layer 25 between the epitaxial contact plug 23 and the second impurity-doped region 37. Otherwise, while the single crystalline semiconductor layer 25 is formed, the impurity-doped contact region 39 may be formed by doping an impurity in-situ or, before the second word lines WL2 are formed, the impurity-doped contact region 39 may be formed by using a separate ion-implantation mask.

Figure 8:
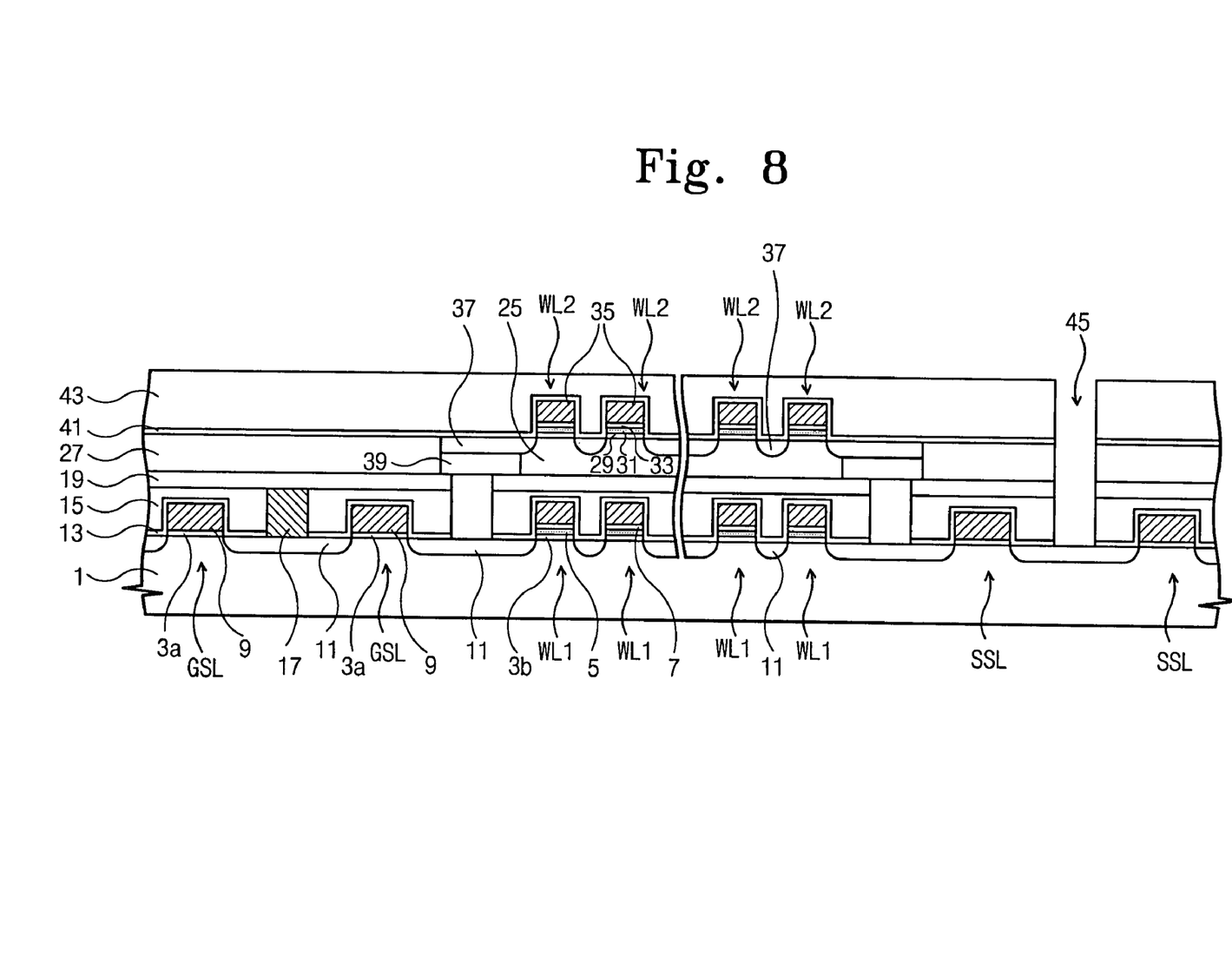

Referring to FIG. 8, a second interlayer dielectric layer 43 is formed on the second etch stopping layer 41. The second interlayer dielectric layer 43, the second etch stopping layer 41, the second device isolation layer 27, the first upper interlayer dielectric layer 19, the first lower interlayer dielectric layer 15, and the first etch stopping layer 13 are patterned to form a bit line contact hole 45 exposing the semiconductor substrate 1 between the string selection line SSL and a neighboring string selection line SSL.

Subsequently, referring to FIG. 2, a conductive layer is formed to fill the bit line contact hole 45 and the conductive layer is patterned to form a bit line contact 47 and the bit line 49, which fills the bit line contact hole 45.

The impurity injection regions 11, 37, the impurity-doped contact region 39, and the epitaxial contact plug 23 may be formed by doping the same type impurity, for example, by doping arsenic or phosphorus at a dose of $1\times10^{18}$ to $1\times10^{20}$ atoms per cm$^3$. A second etch stopping layer 41 is conformably formed in the single crystalline semiconductor layer 25 where the second word lines WL2 are formed.

Figure 9:
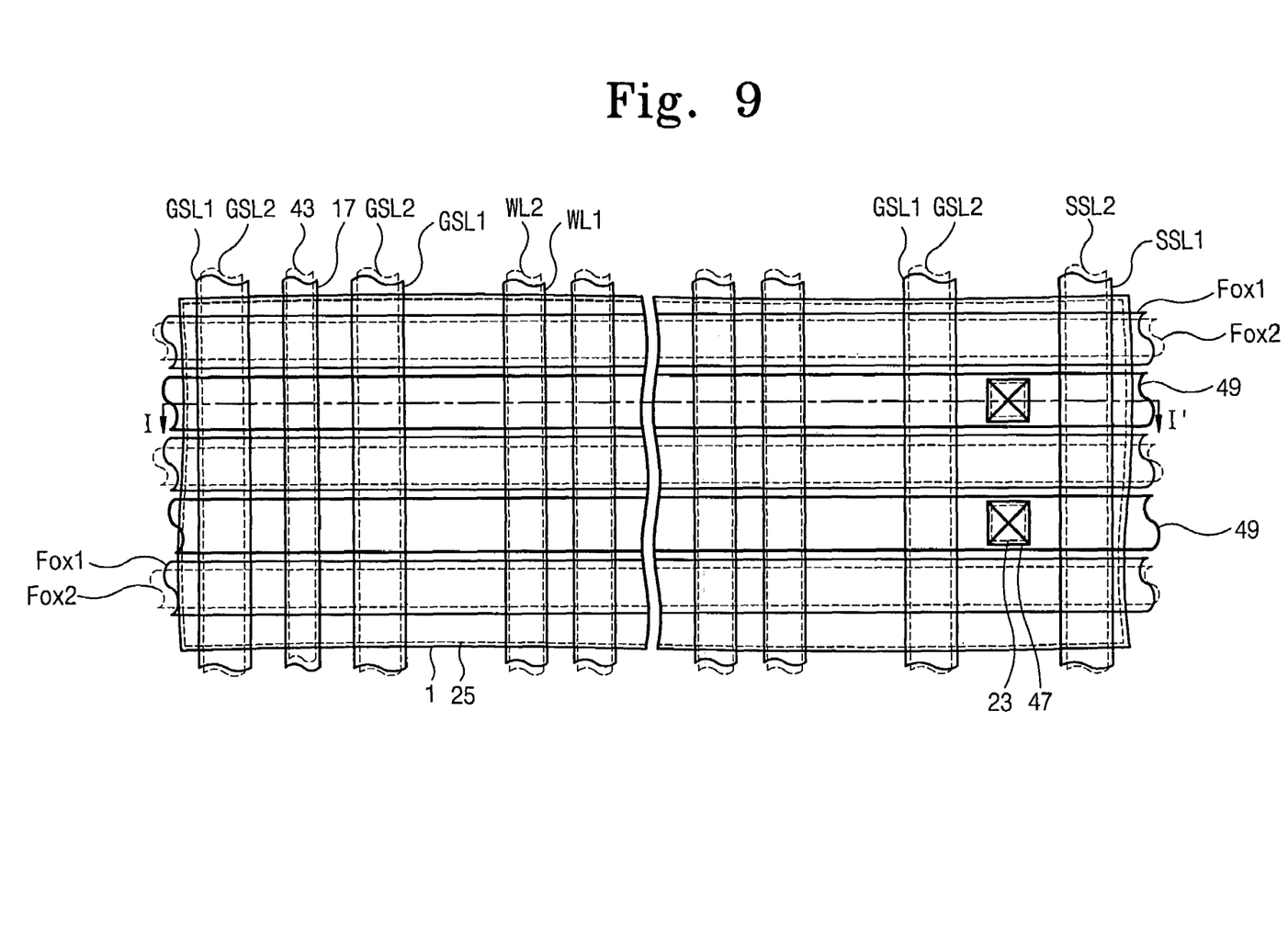
FIG. 9 is a plane diagram illustrating a NAND-type nonvolatile memory device having a stacked structure according to further embodiments of the present invention.
Figure 10:
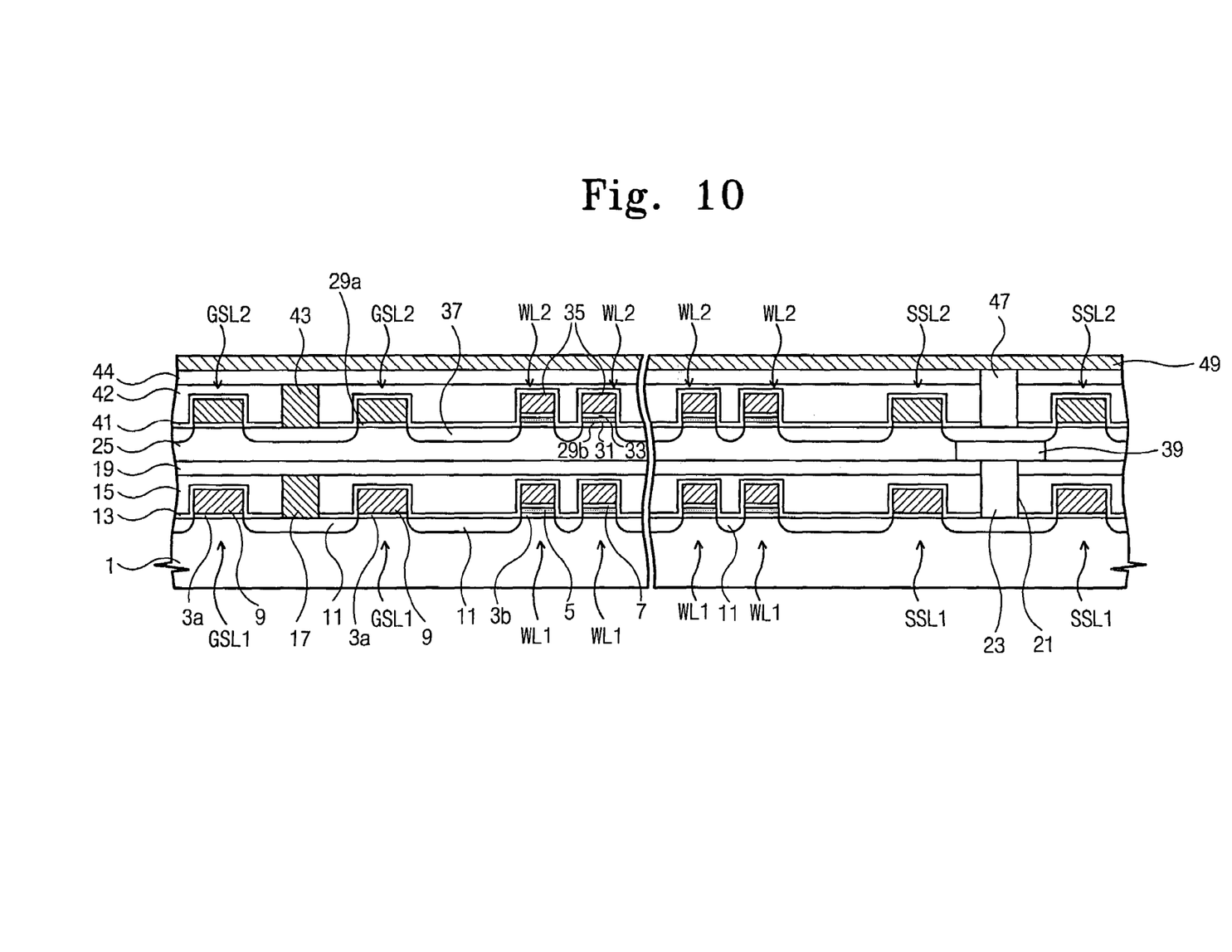
FIG. 10 is a cross-sectional view taken along I-I' line of FIG. 9.

FIG. 9 is a plane view illustrating a NAND-type nonvolatile memory device having a stacked structure according to other embodiments of the present invention. FIG. 10 is a cross-sectional view taken along line of FIG. 9.

Referring to FIG. 9 and FIG. 10, a plurality of parallel first device isolation layers Fox1 are formed in the semiconductor substrate 1 to define an active region, and a first ground selection line GSL1 and a first string selection line SSL1 cross the first device isolation layer Fox1 in parallel. A plurality of first word lines are arranged in parallel between the first ground selection line GSL1 and the first string selection line SSL1. The first word lines WL1 connect to a first cell transistor including a first tunnel insulation layer 3b, a first charge storage layer 5, a first blocking insulation layer 7, and a first gate electrode 9 that are stacked sequentially. The string selection line SSL1 and the first ground selection line GSL1 connect to first string selection transistors and first ground selection transistors, respectively, including a gate electrode 3a and a first gate electrode 9 that are stacked sequentially. The first string selection line SSL1 and the first ground selection line GSL1 do not include the first charge storage layer 5. An etch stopping layer 13, a first lower interlayer dielectric layer 15, and a first upper interlayer dielectric layer 19 are formed to cover the lines GSL1, SSL1, WL1 sequentially. A first impurity-doped region 11 is located in the semiconductor substrate 1 on both sides of the lines GSL1, SSL1, WL1. A first common source line 17 is located between the first ground selection line GSL1 and a neighboring first ground selection line GSL1 and penetrates the first lower interlayer dielectric layer 15 and the first etch stopping layer 13 to contact the first impurity-doped region 11. An epitaxial contact plug 23 is located in a hole 21 that penetrates the first upper interlayer dielectric layer 19, the first lower interlayer dielectric layer 15, and the first etch stopping layer 13 between the first string selection line SSL1 and a neighboring first string selection line SSL1 to contact the first impurity-doped region 11. As shown in FIGS. 8 and 10, the epitaxial contact plug 23 functions as a seed layer for forming a subsequent single crystalline semiconductor layer 25 and as a bit line contact.

Referring to FIG. 9 and FIG. 10, a single crystalline semiconductor layer 25 contacting the epitaxial contact plug 23 is located on the first upper interlayer dielectric layer 19. A second device isolation layer Fox2 is arranged to define an active region in the single crystalline semiconductor layer 25. In the single crystalline semiconductor layer 25, a second ground selection line GSL2, a second string selection line SSL2 and a plurality of second word lines WL2 interposed therebetween are arranged in parallel to cross the second device isolation layer Fox2, 27. The second word lines WL2 connect to second cell transistors including a second tunnel insulation layer 29b, a second charge storage layer 31, a second blocking insulation layer 33, and a second gate electrode 35 that are stacked sequentially. The second string selection line SSL2 and the second ground selection line GSL2 connect to second string selection transistors and second ground selection transistors, respectively, including a gate insulation layer 29a and a second gate electrode 35 that are stacked sequentially. The second string selection line SSL2 and the second ground selection line GSL2 do not include the second charge storage layer 31. The second ground selection line GSL2, the second string selection line SSL2, and the second word lines WL2 overlap the first ground selection line GSL1, the first string selection line SSL1, and the first word lines WL1, respectively. A second impurity injection line 37 is located in the single crystalline semiconductor layer 25 on both sides of the second string selection line SSL2, the second ground selection line GSL2, and the second word lines WL2. An impurity-doped contact region 39 may exist in the single crystalline semiconductor layer 25 between the epitaxial contact plug 23 and the second impurity-doped region 37 to electrically connect the epitaxial contact plug 23 and the second impurity-doped region 37. Otherwise, without the impurity-doped contact region 39, the second impurity-doped region 37 may directly contact the epitaxial contact plug 23.

A second etch stopping layer 41, a second lower interlayer dielectric layer 42, and a second upper interlayer dielectric layer 44 are formed to cover the second lines GSL2, SSL2, WL2 sequentially. A common source line 43 is located between the second ground selection line GSL2 and a neighboring second ground selection line GSL2 and penetrates the second lower interlayer dielectric layer 42 and the second etch stopping layer 41 to contact the second impurity-doped region 37. A bit line contact plug 47 is located in a bit line contact hole (not illustrated) that penetrates the second upper interlayer dielectric layer 44, the second lower interlayer dielectric layer 42, and the second etch stopping layer 41 to expose the single crystalline semiconductor layer 25 between the second string selection line SSL2 and a neighboring second string selection line SSL2. A plurality of parallel bit lines 49 electrically connected to the bit line contact plug 47 are arranged on the second upper interlayer dielectric layer 44.

Referring to FIG. 9 and FIG. 10, a cell string includes a first ground selection transistor connected to the first ground selection line GSL1, a first string selection transistor connected to the first string selection line SSL1, and first cell transistors connected to the word lines WL1 therebetween. Another cell string includes a second ground selection transistor connected to the second ground selection line GSL2, a second string selection transistor connected to the second string selection line SSL2, and second cell transistors connected to the word lines WL2 therebetween. Two cell strings located in an upper and a lower layer are influenced by a voltage applied from the bit line 49 through the bit line contact plug 47 and the epitaxial contact plug 23, respectively.

Although two strings are located in an upper and a lower layer, respectively, the memory device may advantageously use an existing plane view because a flat arrangement of a string in each layer is the same as a conventional NAND-type nonvolatile memory device formed on one layer. Because a cell string in each layer is operated by a ground selection line and a string selection line, each cell string may be separately derived compared with a parallel structure of word lines of the embodiments of FIGS. 1 and 2. Because cell strings are arranged in a plurality of layers, an entire cell size may be reduced regardless of a limit associated with a photolithography process.

Although not illustrated, in a NAND-type nonvolatile memory device of FIG. 9 and FIG. 10, wells (not shown) may be formed in the single crystalline semiconductor layer 25 and the semiconductor substrate 1, such that the wells may be connected to different well contacts (not shown) and applied different voltages.

Although two cell strings are arranged in an upper and a lower layer, respectively, in the embodiments of FIGS. 9 and 10, cell strings may be arranged in more than three layers. Also, nonvolatile memory devices having a structure according to a combination of the embodiments of FIGS. 1 and 2 and the embodiments of FIGS. 9 and 10 may also be formed.

Figure 11:
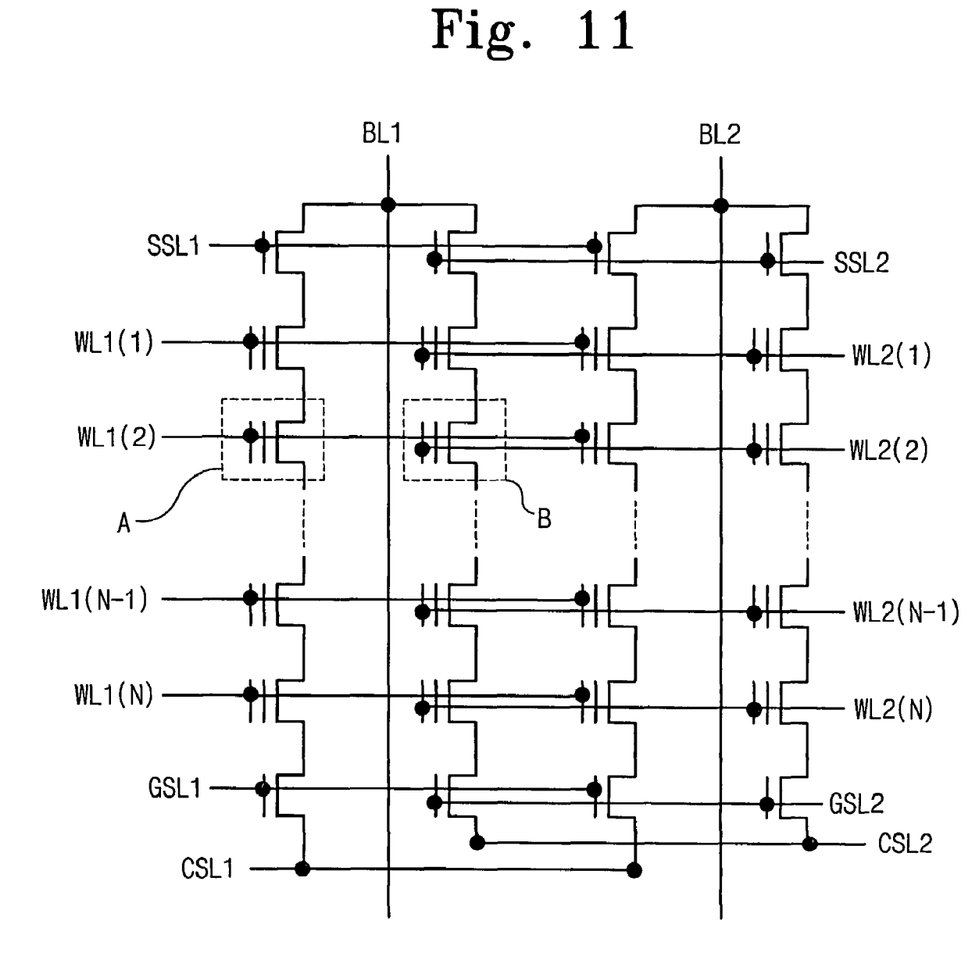
FIG. 11 is an equivalent circuit diagram illustrating a NAND-type nonvolatile memory device of FIG. 9 according to some embodiments of the present invention.

Referring to FIG. 11, methods of operating the NAND-type nonvolatile memory device of FIGS. 9 and 10, according to some embodiments of the present invention, will be described. FIG. 11 is an equivalent circuit diagram illustrating a NAND-type nonvolatile memory device of FIG. 9.

Referring to FIG. 11, one of the bit lines BL1, BL2 is connected to two cell strings of an upper and a lower layer. A cell string includes a first string selection transistor connected to a first string selection line SSL1, a first ground selection transistor connected to a ground selection line GSL1, and n first cell transistors connected to n first word lines WL1(1), WL1(2), ..., WL1(N-1), WL1(N), respectively, between the selection lines SSL1, GSL1. Another cell string includes a second string selection transistor connected to a second string selection line SSL2, a second ground selection transistor connected to a second ground selection line GSL2, and n second cell transistors connected to n second word lines WL2(1), WL2(2), ..., WL2(N-1), WL2(N), respectively, between the selection lines SSL2, GSL2. The cell strings are connected to common source lines CSL1, CSL2 respectively.

In some embodiments illustrated in the equivalent circuit diagram of FIG. 11, methods of programming a cell memory transistor A may be similar to a method of programming an existing NAND-type nonvolatile memory device. That is, zero volts 0V may be applied to a selected first bit line BL1, Vcc (a reference voltage) may be applied to a selected first string selection line SSL1, zero volts 0V may be applied to a selected first ground selection line GSL1, and zero volts 0V may be applied to a selected first common source line CSL1. A program voltage, for example twenty volts 20V, may be applied to a first word line WL1(2) of a selected cell and a pass voltage, for example ten volts 10V, may be applied to first word lines WL1(1), ..., WL1(N-1), WL1(N) of an unselected cell. Second lines SSL2, WL2(1), WL2(2), ..., WL2(N-1), WL2(N), GSL2, CSL2 comprising an upper string connected to the first bit line BL1 may not have a turn-off voltage applied thereto.

When a cell memory transistor B is programmed in the equivalent circuit diagram of FIG. 11, zero volts 0V is applied to a selected first bit line BL1, Vcc (a reference voltage) is applied to a selected second string selection line SSL2, zero volts 0V is applied to a selected second ground selection line GSL2, and zero volts 0V is applied to a selected second common source line CSL2. A program voltage, for example twenty volts 20V, is applied to a second word line WL2(2) of a selected cell, and a pass voltage, for example ten volts 10V, is applied to second word lines WL2(1), ..., WL2(N-1), WL2(N) of an unselected cell. First lines SSL1, WL1(1), WL(2), ..., WL1(N-1), WL1(N), GSL1, CSL1 comprising a lower string connected to the first bit line BL1 do not have a turn-off voltage applied thereto.

When reading a cell memory transistor A in the equivalent circuit diagram of FIG. 11, a selected first string selection line SSL1 and a first ground selection line GSL1 are turned off. A read voltage, for example zero volts 0V, is applied to a first word line WL1(2) of a selected cell and a pass voltage, for example four to five volts, is applied to first word lines WL1(1), ..., WL1(N-1), WL1(N) of an unselected cell. By turning off a second string selection line SSL2 of an unselected cell, current does not flow into an unselected upper string due to a voltage applied via a bit line BL1.

When reading a cell memory transistor B in the equivalent circuit diagram of FIG. 11, a selected second string selection line SSL2 and a second ground selection line GSL2 are turned off. A read voltage, for example zero volts 0V, is applied to a second word line WL2(2) of a selected cell and a pass voltage, for example four to five volts, is applied to second word lines WL2(1), ..., WL2(N-1), WL2(N) of an unselected cell. By turning off an unselected first string selection line SSL1, current does not flow into an unselected upper string due to a voltage applied via a bit line BL1.

In some embodiments illustrated in the equivalent circuit diagram of FIG. 11, an erase operation may be carried out by a block unit.

All word lines in a selected block have zero volts 0V applied thereto and a well (not shown) applies an erase voltage, for example twenty volts 20V, to erase.

Figure 12:
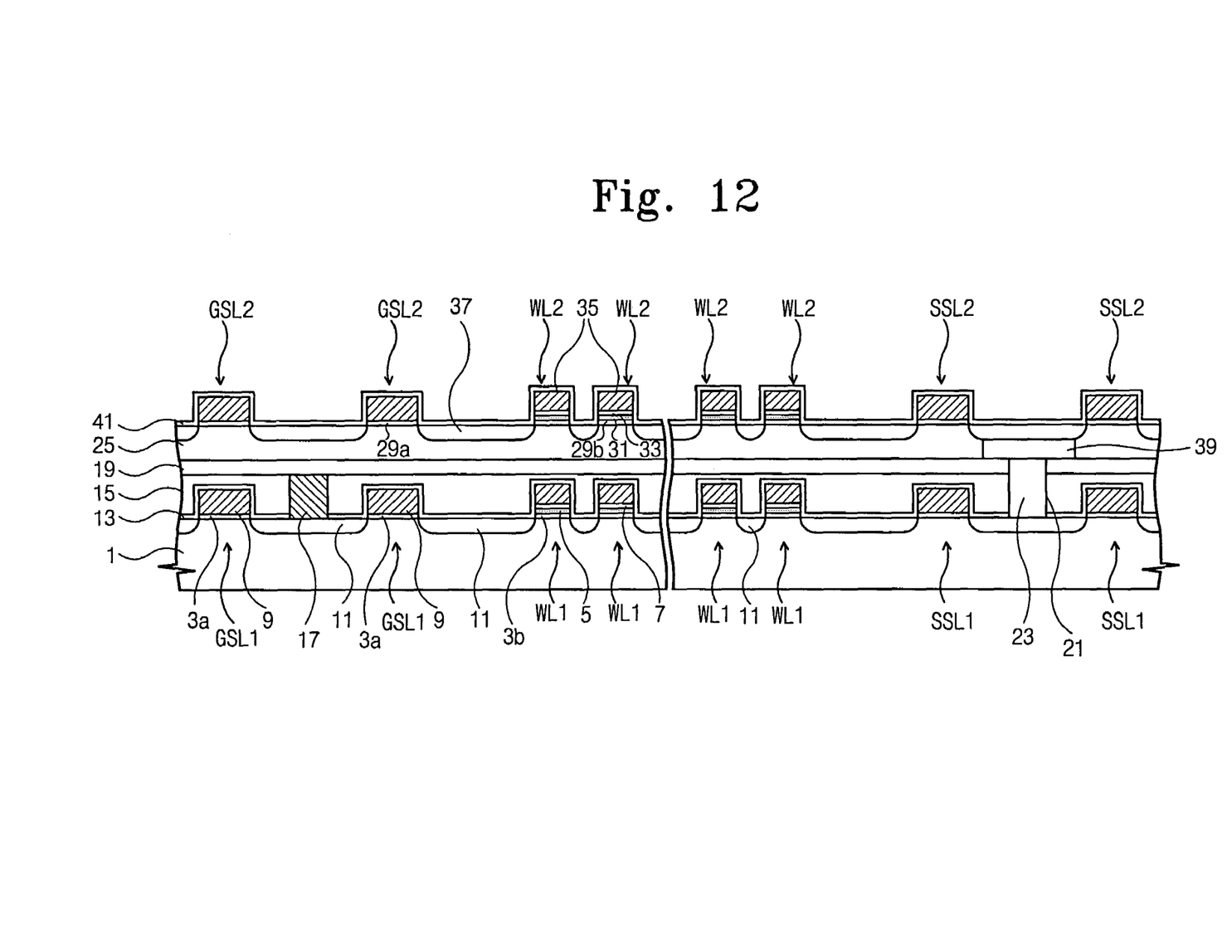
FIG. 12 is a cross-sectional process view illustrating methods of forming a NAND-type nonvolatile memory device of FIG. 10 according to some embodiments of the present invention.

FIG. 12 is a cross-sectional view that illustrates methods of forming a NAND-type nonvolatile memory device of FIG. 10 in accordance with some embodiments of the present invention.

Referring to FIG. 12, a first ground selection line GSL1, a first string selection line SSL1, first word lines WL1, and a first common source line 17 are formed on the semiconductor substrate 1 using methods similar to those discussed above. A first upper interlayer dielectric layer 19, a first lower interlayer dielectric layer 15, and a first etch stopping layer 13 are sequentially patterned to form a hole 21 that exposes the semiconductor substrate 1 between the first string selection line SSL1 and a neighboring first string selection line SSL1. An epitaxial layer is grown in the hole 21 to form an epitaxial contact plug 23 that fills the hole 21. A single crystalline semiconductor layer 25 is formed on the first upper interlayer dielectric layer 19 by methods similar to those discussed above. A second ground selection line GSL2, a second string selection line SSL2, and second word lines WL2 are formed on the single crystalline semiconductor layer 25 in similar fashion to the formation of the first lines GSL1, SSL1, WL1. A second impurity-doped region 37 is formed in the single crystalline semiconductor layer 25 by using an ion-implantation mask in the second lines GSL2, SSL2, WL2. An impurity-doped contact region 39 is formed in the single crystalline semiconductor layer 25 between the epitaxial contact plug 23 and the second impurity-doped region 37. In accordance with various embodiments of the present invention, methods of forming the impurity-doped contact region 39 may have different sequences as discussed above. For conformably covering the second lines GSL2, SSL2, WL2, a second etch stopping layer 41 is formed on an entire surface.

Subsequently, referring to FIG. 10, a second lower interlayer dielectric layer 42 is stacked on the second etch stopping layer 41. The second lower interlayer dielectric layer 42 and the second etch stopping layer are penetrated between the second ground selection line GSL2 and a neighboring second ground selection line GSL2 to form a second common source line 43 contacting the second impurity-doped region 37. A second upper interlayer dielectric layer 44 is formed on the second lower interlayer dielectric layer 42. The second upper interlayer dielectric layer 44, the second lower interlayer dielectric layer 42, and the second etch stopping layer 41 are penetrated between the second string selection line SSL2 and a neighboring second string selection line to form a bit line contact plug 47 contacting the second impurity-doped region 37. A bit line 49 connected to the bit line contact plug 47 is formed on the second upper interlayer dielectric layer 44 to complete a NAND-type nonvolatile memory device as shown in FIG. 10. The process conditions associated with the embodiments of FIGS. 12 and 10 may be the same as those used in the embodiments discussed above. Although not illustrated, control circuits such as a row recorder may be formed on the single crystalline semiconductor layer 25.

According to some embodiments of NAND-type nonvolatile memory devices and methods of forming the same, word lines may be formed using a plurality of layers to reduce cell size area. In addition, a number of cell arrays may increase so as to increase cell memory capacity.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

That which is claimed:

1. A NAND-type nonvolatile memory device, comprising:
   a semiconductor substrate;
   a first ground selection line and a first string selection line disposed on the substrate in parallel to each other;
   a plurality of parallel first word lines interposed on the substrate between the first ground selection line and the first string selection line;
   a first impurity-doped region formed in the semiconductor substrate adjacent to the first word lines, the first ground selection line, and the first string selection line;
   a first interlayer dielectric layer disposed on the first ground selection line, the first string selection line, the plurality of first word lines, and the semiconductor substrate;
   an epitaxial contact plug that contacts the semiconductor substrate through the first interlayer dielectric layer;
   a single crystalline semiconductor layer disposed on the first interlayer dielectric layer that contacts the epitaxial contact plug;
   a plurality of parallel second word lines disposed on the single crystalline semiconductor layer;
   a second impurity-doped region formed in the single crystalline semiconductor layer adjacent to the second word lines; and
   a second interlayer dielectric layer disposed on the plurality of second word lines and the single crystalline semiconductor layer;
   wherein the epitaxial contact plug comprises a first epitaxial contact plug that is located between the plurality of first word lines and the first ground selection line and a second epitaxial contact plug that is located between the plurality of first word lines and the first string selection line, the first epitaxial contact plug electrically connecting the first impurity-doped region between the plurality of first word lines and the first ground selection line to the second impurity-doped region on a first side of the second word lines and the second epitaxial contact plug electrically connecting the first impurity-doped region between the plurality of first word lines and the first string selection line to the second impurity-doped region on a second side of the second word lines.

2. The NAND-type nonvolatile memory device of claim 1, wherein the first and the second word lines each comprise a tunnel insulation layer, a charge storage layer, a blocking insulation layer, and a gate electrode that are stacked sequentially.

3. The NAND-type nonvolatile memory device of claim 1, wherein the first string selection line comprises a plurality of first string selection lines, the device further comprising:
   a bit line contact that contacts the first impurity-doped region between one of the first string selection lines and a neighboring one of the first string selection lines through the second interlayer dielectric layer and the first interlayer dielectric layer; and
   a bit line disposed on the second interlayer dielectric layer that contacts the bit line contact.

4. The NAND-type nonvolatile memory device of claim 3, further comprising a device isolation layer that contacts the first interlayer dielectric layer through the single crystalline semiconductor layer to define an active region of the single crystalline layer;
   wherein the bit line contact penetrates the second interlayer dielectric layer, the device isolation layer, and the first interlayer dielectric layer.

5. The NAND-type nonvolatile memory device of claim 1, further comprising:
   an impurity-doped contact region in the single crystalline semiconductor layer between the second impurity-doped region and the epitaxial contact plug.

* * * * *